(12) United States Patent
Doris et al.

(10) Patent No.: US 9,287,135 B1
(45) Date of Patent: Mar. 15, 2016

(54) SIDEWALL IMAGE TRANSFER PROCESS FOR FIN PATTERNING

(71) Applicant: International Business Machines Corporation, Armonk, NY (US)

(72) Inventors: Bruce B. Doris, Slingerlands, NY (US); Hong He, Schenectady, NY (US); Sivananda K. Kanakasabapathy, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/721,430

(22) Filed: May 26, 2015

(51) Int. Cl.
| | | |
|---|---|---|
| *H01L 21/31* | (2006.01) | |
| *H01L 21/30* | (2006.01) | |
| *H01L 21/311* | (2006.01) | |
| *H01L 21/02* | (2006.01) | |
| *H01L 21/321* | (2006.01) | |

(52) U.S. Cl.
CPC ...... *H01L 21/31144* (2013.01); *H01L 21/0217* (2013.01); *H01L 21/0228* (2013.01); *H01L 21/02164* (2013.01); *H01L 21/02274* (2013.01); *H01L 21/3212* (2013.01)

(58) Field of Classification Search
CPC .................. H01L 21/30–21/32; H01L 21/02; H01L 21/46
USPC .......... 438/696–706, 736, 717; 257/401, 618, 257/632–637, 288, E21.235, E21.24
See application file for complete search history.

(56) References Cited

U.S. PATENT DOCUMENTS

| | | |
|---|---|---|
| 6,875,703 B1 | 4/2005 | Furukawa et al. |
| 8,524,605 B1 | 9/2013 | Chen |
| 8,669,186 B2 | 3/2014 | LiCausi |
| 8,883,649 B2 | 11/2014 | Yin et al. |
| 8,889,561 B2 | 11/2014 | Woo et al. |
| 2007/0138516 A1* | 6/2007 | Bach ..................... H01L 27/115 257/288 |

(Continued)

*Primary Examiner* — Amar Movva
*Assistant Examiner* — Sheikh Maruf
(74) *Attorney, Agent, or Firm* — Wu-Song Huang; Yuanmin Cai

(57) ABSTRACT

A method of using sidewall image transfer (SIT) process to pattern fin structures is provided. The method includes providing a fin-patterning substrate containing a first hard-mask layer and a second hard-mask layer over a semiconductor substrate. Trench openings formed on the semiconductor substrate extending vertically through the first hard-mask layer and the second hard-mask layer. Trench openings are filled with a third hard-mask material. The second hard-mask layer is removed to reveal hard-mask mandrels. First sidewall spacers are formed on the opposite sides of the hard-mask mandrels using atomic layer deposition (ALD) process. The semiconductor substrate is etched using the first sidewall spacers and the hard-mask mandrels as mask, subsequently the spacers, the mandrels and the hard-mask layer are removed to reveal fin structures. The method of the present invention is to form fins at a very tight fin pitch by using the very tight thickness controllability of ALD process. By repeating the ALD step twice or more to form multiple SIT spacers the fin pitch size can be reduced further. The inventive method is suitable for fabricating tight fin pitch to less than about 20 nm.

20 Claims, 15 Drawing Sheets

(56) References Cited

U.S. PATENT DOCUMENTS

| | | | |
|---|---|---|---|
| 2009/0137093 A1* | 5/2009 | Lin | H01L 27/10876 438/421 |
| 2009/0163008 A1* | 6/2009 | Purayath | H01L 27/105 438/586 |
| 2011/0309333 A1* | 12/2011 | Cheng | B82Y 10/00 257/24 |
| 2012/0235247 A1* | 9/2012 | Cai | H01L 21/3086 257/392 |
| 2012/0313170 A1* | 12/2012 | Chang | H01L 29/66545 257/347 |
| 2013/0093026 A1* | 4/2013 | Wann | H01L 21/823821 257/401 |
| 2013/0168771 A1* | 7/2013 | Wu | H01L 27/1211 257/351 |
| 2013/0200449 A1* | 8/2013 | Chen | H01L 21/823431 257/296 |
| 2013/0221491 A1* | 8/2013 | Wann | H01L 21/823431 257/618 |

* cited by examiner

SIDEWALL IMAGE TRANSFER PROCESS FOR FIN PATTERNING

FIELD OF THE INVENTION

This invention relates generally to a method for fin patterning, and more particularly to a method of using sidewall image transfer process to pattern fin structures.

BACKGROUND OF THE INVENTION

In the fabrication of integrated circuits, lithography is used to generate pattern structures on the semiconductor and various materials for the construction of the desired circuit structures. A continuing demand in view of the ever increasing desire in the semiconductor industry for higher circuit density in microelectronic devices has prompted lithographic engineers to develop improved lithographic processes. As the circuit density of semiconductor devices increases, higher resolution of circuit patterns in resist films is increasingly demanded. One way of improving the resolution in resist is to migrate to shorter wavelength from 365 nm to 248 nm, then to 193 and 157 nm, and further to extremely short optical wavelengths like EUV (extreme ultraviolet), or to adopt non optical system such as E-beam. The EUV lithography with exposure wavelengths below 20 nm would allow the industry to print features beyond the diffraction limit of the current 193 nm lithography without resorting to the adoption of tricks using double or triple patterning. Nevertheless, the adoption of EUV technology has been delayed for several times due to its limitations in power source for meeting throughput requirement in manufacturing. In addition, the equipment and mask for EUV lithography are very expensive. Therefore, it is highly desirable to provide a new method to produce fine features without requiring the use of new and more expensive tooling. One technique emerged, which only requires ArF (193 nm) deep UV (DUV) immersion lithography in combination with spacer deposition, is called sidewall image transfer (SIT). This spacer based SIT technique can print very fine features by doubling, quadrupling or sextupling the pattern density with multiple deposition and etching schemes.

The fin field effect transistor (FinFET) has advantages over bulk metal oxide semiconductor FET (MOSFET) in the aspects of: reduced leakage, excellent sub-threshold slop, and better voltage gain without degradation of noise or linearity. Therefore, FinFET structure is desired device architecture for high end devices such as microprocessors. In fabricating FinFET, small fin width keeps the short channel effect under control, and small fin pitch enables comparable or even higher area efficiency in terms of the current per device width ratio. Small fin pitch is extremely difficult to fabricate especially when the pitch sizes reach sub 30 nm or sub 20 nm range in the future device generations. Double SIT and triple SIT processes provide ways to fabricate fin structures with pitch sizes in this range. Although Furukawa et al., in U.S. Pat. No. 6,875,703, teach a method of making a quadruple density SIT structure, and Chen, in U.S. Pat. No. 8,524,605, teaches a method of forming patterned features having pitch reduced to one sixth of the original value defined by the minimum resolution of a lithographic tool, they are not practical for fabricating fin structures with sub 30 nm fin pitch. Therefore, there is a need to have a new SIT process to be able to fabricate sub 30 or sub 20 nm fin pitches in FinFET fabrication.

SUMMARY OF THE INVENTION

According to an aspect of the present invention, there is provided a method for fin patterning containing: providing a fin-patterning substrate containing a first hard-mask layer and a second hard-mask layer over a semiconductor substrate, wherein the second hard-mask layer is on top of the first hard-mask layer; forming a plurality of trench openings on the semiconductor substrate extending vertically through the first hard-mask layer and the second hard-mask layer; filling the plurality of trench openings with a third hard-mask material to form a plurality of hard-mask mandrels; removing the second hard-mask layer to reveal the plurality of hard-mask mandrels protruding above the first hard-mask layer over the semiconductor substrate; forming a layer of first spacer material covering top of the first hard-mask layer under openings which are formed after the removing the second hard-mask layer, and covering top and sides of the plurality of hard-mask mandrels; removing first spacer material from the top of the first hard-mask layer and the top of the hard-mask mandrels, and from sides on two line ends of each hard-mask mandrel to form a plurality of first sidewall spacers; etching through the first hard-mask layer under openings, which are located directly on top of the first hard-mask layer and are on areas where the first spacer material is removed, into the semiconductor substrate to form fin structures under the first sidewall spacers; and removing the plurality of hard-mask mandrels, the plurality of first sidewall spacers and the first hard-mask layer to reveal the fin structures.

The provided semiconductor substrate may be a silicon wafer, a silicon germanium wafer, a silicon on insulator (SOI) wafer, or any other commonly used semiconductor wafer. The material for the first hard-mask layer may be silicon oxide, and the material for the second hard-mask layer may be silicon nitride. The trench openings created on the fin-patterning substrate is obtained through a regular photolithographic process. In the process of forming a plurality of trench openings on the fin-patterning substrate, first a patterned resist is formed on the second hard-mask layer, within which the patterned resist contains a trench pattern defined therein, and then the trench pattern from the patterned resist is transferred to the semiconductor substrate by etching through the first and second hard-mask layer to the semiconductor substrate to form the plurality of trench openings. To define the trench pattern, a resist is patterned through a coating, exposing, baking and developing process. The trench openings may be filled in with a third hard-mask material which may be the same material as the first hard-mask material, such as silicon oxide, to form a plurality of hard-mask mandrels. Many different oxides may be used to fill the trench openings with different deposition processes. The filling process may be a typical shallow trench isolation (STI) process. It may be achieved by: performing high-density plasma chemical vapor deposition (HDPCVD) or atmospheric pressure chemical vapor deposition (APCVD) to fill the plurality of trench openings with HDPCVD oxide or APCVD oxide; and performing a planarization process with chemical mechanical polishing (CMP) to remove the HDPCVD oxide or the APCVD oxide atop of the second hard-mask layer. After filling the trench openings, the second hard-mask layer is then removed to reveal the plurality of hard-mask mandrels. The removal process may be a wet etch process, such as: exposing the fin-patterning substrate to a chemical solution which contains a sulfuric acid component and a hydrogen peroxide component.

A layer of first spacer material is formed to cover the top of the first hard-mask layer, and to cover the top and all sides of the hard-mask mandrels by conformally depositing the first spacer material onto the fin-patterning substrate using atomic layer deposition (ALD) process. The material of the first spacer on the tops of the first hard-mask layer and the hard-mask mandrels is removed with anisotropic reactive ion etching (RIE). The material of the first spacer on the two sides of the two line ends of each hard-mask mandrel is removed by tilt angle ion beam by orienting each side of the two line ends to have a non orthogonal tilt angle between a path of the ion beam and the surface of the side being etched. After etching, the material of the first spacer on the two sidewalls of the hard-mask mandrels is left to form a plurality of first sidewall spacers. The plurality of hard-mask mandrels and the plurality of first sidewall spacers are used as mask, and a breakthrough etch step is used to remove the first hard-mask layer under the openings or open areas which are not covered by the hard-mask mandrels and the first sidewall spacers. After the breakthrough etch step, a new etchant may be used to etch the semiconductor substrate to form fin structures. The new etchant may contain HBr. The hard-mask mandrels, the first sidewall spacers and the remaining first hard-mask layer are removed to reveal fin structures by exposing the fin-patterning substrate to an oxide removal agent which includes hydrogen fluoride in an aqueous solution in a range of approximately 5:1 to 20,000:1 (water:hydrogen fluoride). The fin structures may have a fin pitch less than about 20 nm.

According to another aspect of the present invention, there is provided a method for fin patterning containing: providing a fin-patterning substrate containing a first hard-mask layer and a second hard-mask layer over a semiconductor substrate, wherein the second hard-mask layer is on top of the first hard-mask layer; forming a plurality of trench openings on the semiconductor substrate extending vertically through the first hard-mask layer and the second hard-mask layer; filling the plurality of trench openings with a third hard-mask material to form a plurality of hard-mask mandrels; removing the second hard-mask layer to reveal the plurality of hard-mask mandrels protruding above the first hard-mask layer over the semiconductor substrate; forming a layer of first spacer material covering top of the first hard-mask layer under openings which are formed after the removing the second hard-mask layer, and top and sides of the plurality of hard-mask mandrels; removing first spacer material from the top of the first hard-mask layer and the top of the hard-mask mandrels, and from sides on two line ends of each hard-mask mandrel to form a plurality of first sidewall spacers; forming a layer of second spacer material covering all tops and sides adjacent to air of the first hard-mask layer, the plurality of hard-mask mandrels, and the plurality of first sidewall spacers; removing second spacer material from the tops and sides of the first hard-mask layer, the plurality of hard-mask mandrels, and the plurality of first sidewall spacers, except two opposite sidewalls of each of the first sidewall spacers to form a plurality of second sidewall spacers; forming third spacers with a third spacer material directly on top of the first hard-mask layer under openings which are formed after the removing second spacer material; removing the plurality of second sidewall spacers; etching through the first hard-mask layer under openings, which are located directly on top of the first hard-mask layer and are on areas where the second sidewall spacers are removed, into the semiconductor substrate to form fin structures under the first sidewall spacers and the third spacers; and removing the plurality of hard-mask mandrels, the plurality of first sidewall spacers, the third spacers and the first hard-mask layer to reveal the fin structures.

The provided semiconductor substrate may be a silicon wafer, a silicon germanium wafer, a silicon on insulator (SOI) wafer, or any other commonly used semiconductor wafer. The material for the first hard-mask layer may be silicon oxide, and the material for the second hard-mask layer may be silicon nitride. The trench openings created on the fin-patterning substrate is obtained through a regular photolithographic process. In the process of forming a plurality of trench openings on the fin-patterning substrate, first a patterned resist is formed on the second hard-mask layer, within which the patterned resist contains a trench pattern defined therein, and then the trench pattern from the patterned resist is transferred to the semiconductor substrate by etching through the first and second hard-mask layer to the semiconductor substrate to form the plurality of trench openings. To define the trench pattern, a resist is patterned through a coating, exposing, baking and developing process. The trench openings may be filled in with a third hard-mask material which may be the same material as the first hard-mask material, such as silicon oxide, to form a plurality of hard-mask mandrels. Many different oxides may be used to fill the trench openings with different deposition processes. The filling process may be a typical shallow trench isolation (STI) process. It may be achieved by: performing high-density plasma chemical vapor deposition (HDPCVD) or atmospheric pressure chemical vapor deposition (APCVD) to fill the plurality of trench openings with HDPCVD oxide or APCVD oxide; and performing a planarization process with chemical mechanical polishing (CMP) to remove the HDPCVD oxide or the APCVD oxide atop of the second hard-mask layer. After filling the trench openings, the second hard-mask layer is then removed to reveal the plurality of hard-mask mandrels. The removal process may be a wet etch process, such as: exposing the fin-patterning substrate to a chemical solution which contains a sulfuric acid component and a hydrogen peroxide component.

A layer of first spacer material is formed to cover the top of the first hard-mask layer, and to cover the top and all sides of the hard-mask mandrels by conformally depositing the first spacer material onto the fin-patterning substrate using atomic layer deposition (ALD) process. The material of the first spacer on the tops of the first hard-mask layer and the hard-mask mandrels is removed with anisotropic reactive ion etching (RIE). The material of the first spacer on the two sides of the two line ends of each hard-mask mandrel is removed with tilt angle ion beam by orienting each side of the two line ends to have a non orthogonal tilt angle between a path of the ion beam and the surface of the side being etched. After etching, the material of the first spacer on the two sidewalls of the hard-mask mandrels is left to form a plurality of first sidewall spacers. For example, the spacer removal may be accomplished using a tilted ion angle implant of Xe, Si or Ge followed by a wet etch of hydrofluoric acid. A layer of second spacer material is formed to cover the top of the first hard-mask layer under the openings which are formed after the removal of the material of the first spacer, and to cover the tops and all sides adjacent to air of both the hard-mask mandrels and the first sidewall spacers by depositing the first conformal spacer material onto the fin-patterning substrate using atomic layer deposition (ALD) process. The second spacer material may be amorphous silicon, amorphous carbon, or amorphous silicon germanium. The material of the second spacer on the tops of the first hard-mask layer, the hard-mask mandrels and the first sidewall spacers is removed with anisotropic reactive ion etching (RIE). The material of the second spacer on the two sides of the two line ends of each hard-mask mandrel and each first sidewall spacer is removed with tilt angle ion beam by orienting each side of the two line ends to have a non orthogonal tilt angle between a path of the ion beam and the surface of the side being etched. For example, the spacer removal may be accomplished using a tilted ion angle implant of Xe, Si or Ge followed by a wet etch of hydrofluoric acid. Material of the second spacer on two opposite sidewalls of each of the first sidewall spacers is left to form a plurality of second sidewall spacers. Material of the third spacer formed directly on top of the first hard-mask layer under openings which are formed after the removal of the material of the second spacer may be the same as the material of the first spacer. The plurality of second sidewall spacers may be removed with RIE. The plurality of hard-mask mandrels, the plurality of first sidewall spacers and the plurality of third spacers are used as etch mask, and a breakthrough etch step is used to remove the first hard-mask layer under the openings. After the breakthrough etch step, a new etchant may be used to etch the semiconductor substrate to form fin structures. The new etchant may contain HBr. The hard-mask mandrels, the first sidewall spacers, the third spacers and the remaining first hard-mask layer are removed to reveal fin structures by exposing the fin-patterning substrate to an oxide removal agent which includes hydrogen fluoride in an aqueous solution in a range of approximately 5:1 to 20,000:1 (water:hydrogen fluoride). The fin structures may have a fin pitch less than about 20 nm.

BRIEF DESCRIPTION OF THE DRAWINGS

The present invention may best be understood from the following detailed description of preferred embodiments, taken in conjunction with the appended drawings, and in which.

Figure 1:
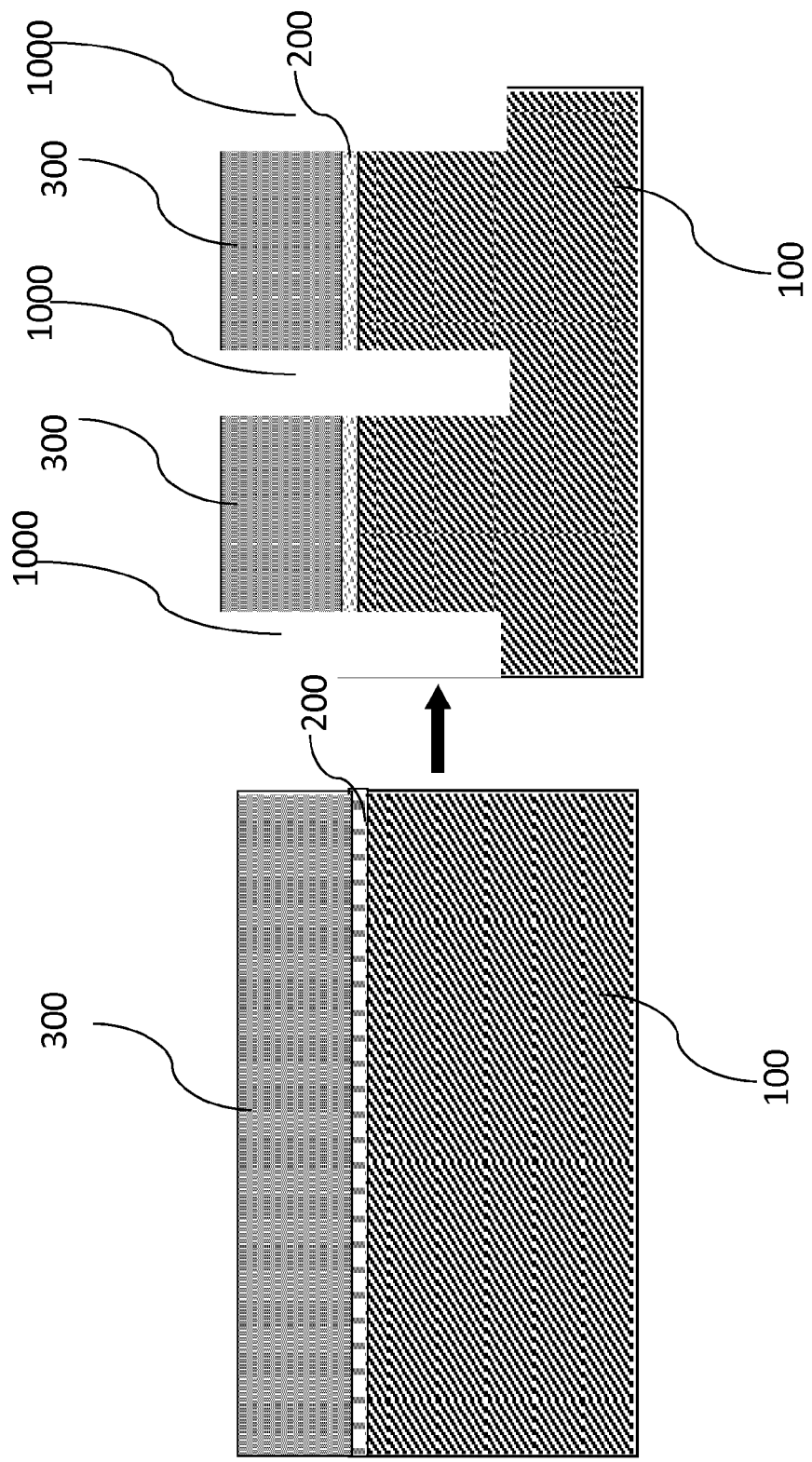
FIG. 1A is a schematic cross-sectional diagram representing a fin-patterning substrate containing a first hard-mask layer and a second hard-mask layer over a semiconductor substrate.
FIG. 1B is a schematic cross-sectional diagram representing a plurality of trench openings are formed on the fin-patterning substrate according to one embodiment of the present invention.
Figure 2:
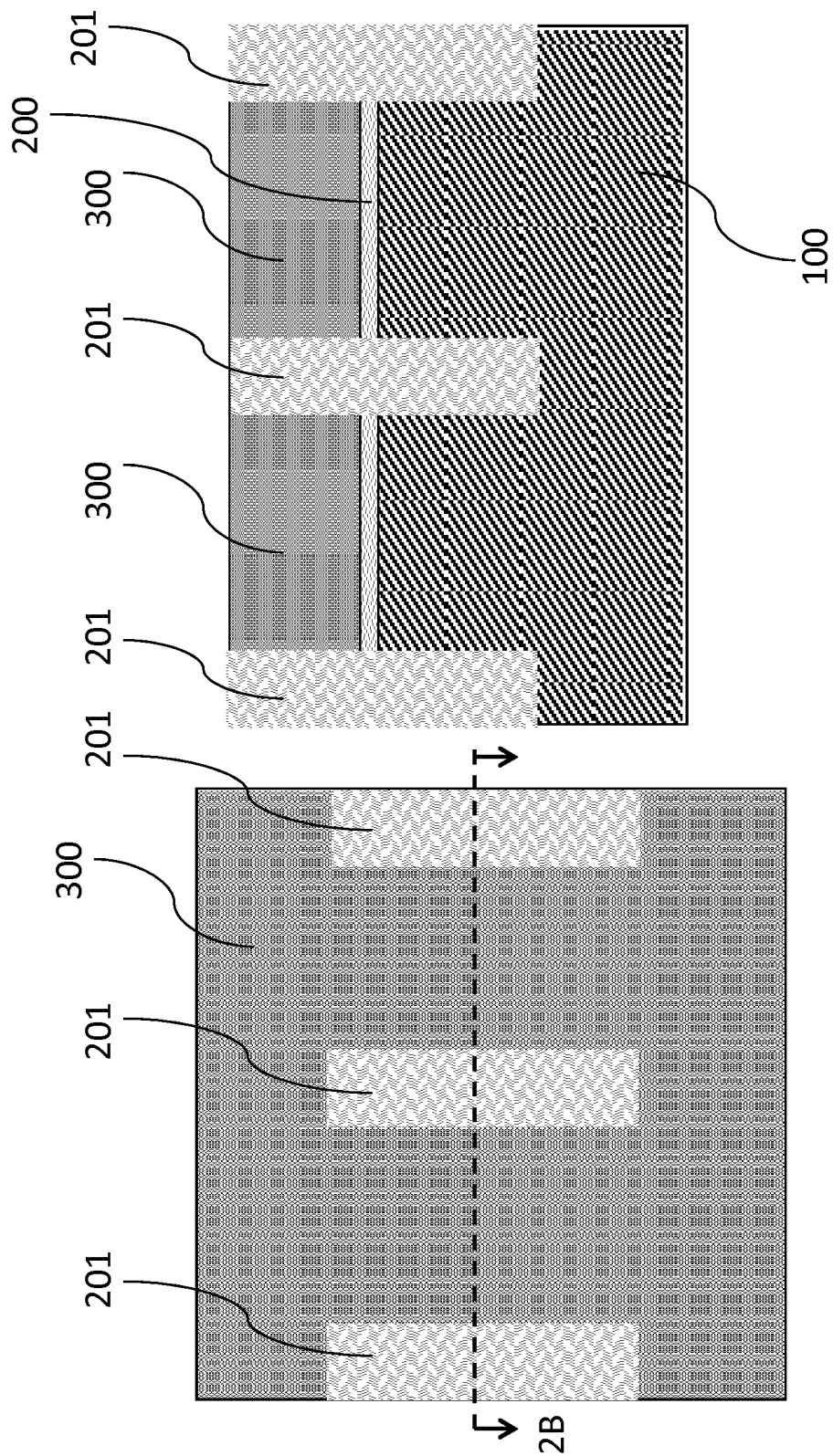
FIG. 2A is a schematic top-view diagram representing the trench openings of FIG. 1B are filled with a shallow trench isolation process on the fin-patterning substrate.
FIG. 2B is a schematic cross-sectional diagram representing the trench openings of FIG. 1B are filled with a shallow trench isolation process on the fin-patterning substrate according to one embodiment of the present invention.
Figure 3:
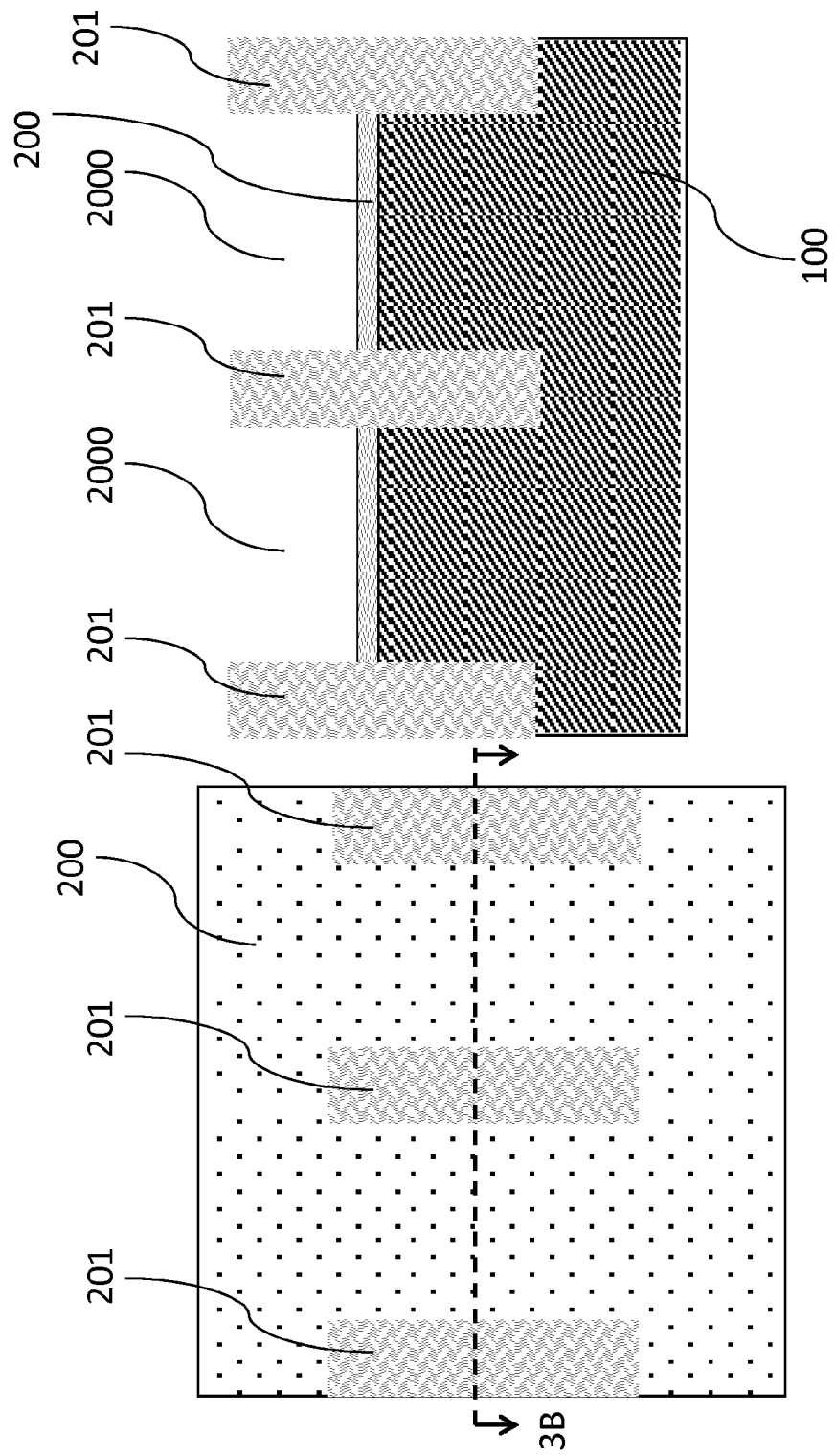
FIG. 3A is a schematic top-view diagram representing the second hard-mask layer of FIGS. 2A and 2B is removed from the fin-patterning substrate.
FIG. 3B is a schematic cross-sectional diagram representing the second hard-mask layer of FIGS. 2A and 2B is removed from the fin-patterning substrate according to one embodiment of the present invention.

Since the drawings in FIGS. 1-15 are intended for illustrative purpose, the elements in the drawings are not necessarily drawn to scale. For example, some of the elements may be enlarged or exaggerated for clarity purpose.

DETAILED DESCRIPTION OF PREFERRED EMBODIMENTS

This invention relates generally to a method for fin patterning. Specifically, the present invention uses sidewall image transfer (SIT) process to pattern small fin structures with small fin pitches. More specifically, the method of present invention is capable of fabricating fin structures with fin pitch below 20 nm.

The SIT process doubles the spatial frequency of a template or a mandrel, is also called self-aligned double patterning (SADP) process. The process involves the deposition of a spacer along the sidewalls of a mandrel followed by etching off the mandrel. The pattern of the template or the mandrel may be obtained with a conventional lithography such as, an ArF (193 nm) deep UV (DUV) immersion lithography. The remaining sidewall features may then be used for patterning the device structures. For a double SIT process, which may also be called self-aligned quadruple patterning (SAQP) process, it may be provided for forming image structures with a quadruple density. First spacers are formed on opposite sidewalls of a first mandrel. The first spacers form second mandrels by removing the first mandrel. Second spacers are formed on the opposite sidewalls of the second mandrels (the first spacers). After removing the second mandrels, the remaining quadruple density sidewall features may then be used for patterning the device structures. Therefore, a multiple SIT process may be provided for forming a multiple density image structures with multiple spacers. The present invention uses a SIT process with one or more spacers to pattern small fin structures having small fin pitches.

FinFET devices are increasingly being adopted to replace MOSFETs in sub-45 nm complementary metal-oxide semiconductor (CMOS) technologies due to their improved sub threshold and short channel behavior, associated with low leakage currents. Fin pitch of FinFET device is getting smaller/tighter when the technology continues to migrate to future nodes. When the technology reaches 7 or 5 nm node, the FinFET may require a fin pitch at 30 nm or below. Complicate and expensive pattern processes are used to meet the needs of very tight fin pitch, as the example of using double or triple SIT, or using expensive EUV patterning. In the present invention, a new method is invented to pattern fins. Compared to double SIT, this process is more practical to scale down fin pitch, plus is much more economical than EUV. The present invention uses hard-mask material filled deep trenches to create mandrels for fabricating fin structures, thus it may reduce pitch walking (moving of the feature location) issue commonly associated with SIT process. The method of the present invention is to form fins at a very tight fin pitch by using the very tight thickness controllability of atomic layer deposition (ALD) process. By repeating this ALD step twice to form the SIT spacers, one can reduce the fin pitch size even more. Therefore, the present invention provides a method of being capable of fabricating FinFET devices with fin pitch at 20 nm and below.

In its basic form, a FinFET device includes a source, a drain and one or more fin-shaped channels (e. g., tall, thin semiconductive members) between the source and the drain. A gate electrode over the fin(s) regulates electron flow between the source and the drain. In operation, a current through the fin between the source and drain is controlled by selectively energizing the gate. Advantageously, FinFETs may have significantly faster switching times and higher current density than conventional MOSFETs. In addition, FinFETs also typically offer greater control over channel voltages and resistance to short-channel effects. The present invention is suitable for fabricating tight fin pitch FinFET devices for microprocessors. It is also suitable for fabricating any structures require small pitches such as memory devices (NAND flash and DRAM) or other electronic devices.

One embodiment of the present invention includes a method for fin patterning. The method contains the following steps: providing a fin-patterning substrate containing a first hard-mask layer and a second hard-mask layer over a semiconductor substrate, wherein the second hard-mask layer is on top of the first hard-mask layer; forming a plurality of trench openings on the semiconductor substrate extending vertically through the first hard-mask layer and the second hard-mask layer; filling the plurality of trench openings with a third hard-mask material to form a plurality of hard-mask mandrels; removing the second hard-mask layer to reveal the plurality of hard-mask mandrels; forming a layer of first spacer material covering top of the first hard-mask layer under openings, and covering top and sides of the plurality of hard-mask mandrels; removing first spacer material from the top of the first hard-mask layer and the top of the hard-mask mandrels, and from sides on two line ends of each hard-mask mandrel to form a plurality of first sidewall spacers; etching through the first hard-mask layer under openings into the semiconductor substrate to form fin structures under the first sidewall spacers; and removing the plurality of hard-mask mandrels, the plurality of first sidewall spacers and the first hard-mask layer to reveal the fin structures. The sequence of the steps as described above is preferred. However, the invention is not limited to the performance of these steps with the sequence or order presented above. Many steps may also be applied to the fin-patterning substrate before, between or after the steps shown above. FIGS. 1-7 are demonstrative illustrations of cross-sectional views or top views of structures in the method of fin patterning of the embodiment of the present invention.

Referring to FIG. 1A, a substrate for fin patterning, called fin-patterning substrate in the present invention, containing a first hard-mask layer 200 and a second hard-mask layer 300 over a semiconductor substrate 100 is provided, within which the second hard-mask layer 300 is on top of the first hard-mask layer 200. The semiconductor substrate 100 is usually a silicon wafer. The semiconductor substrate 100 is also suitably any substrate conventionally used in the semiconductor process. For example, the semiconductor substrate 100 may contain a semiconducting material, such as: silicon, silicon germanium, or gallium arsenide, and it may also contain an additional non-semiconducting material such as: silicon oxide, aluminum, aluminum oxide, ceramic, quartz, copper or any combination thereof, including multilayers. The semiconductor substrate 100 can include one or more semiconductor layers or structures and can include active or operable portions of semiconductor devices. The semiconductor substrate 100 may be a semiconductor on insulator (SOI) wafer. The first hard-mask layer 200 may include silicon oxide, silicon nitride, boron nitride, metal, metal nitride, and/or metal oxide and may have a thickness ranging from about 8 nm to about 40 nm. The preferred material for the first hard-mask layer 200 is silicon oxide. The material for the second hard-mask layer 300 is different from that for the first hard-mask layer 200, and has an etch property different from that of the first hard-mask layer 200 for better etch selectivity in the subsequent etch step. The second hard-mask layer 300 may include silicon oxide, silicon nitride, titanium nitride, boron nitride, amorphous carbon, metal, and/or metal oxide, and may have a thickness ranging from about 8 nm to about 50 nm. The preferred material for the second hard-mask layer 300 is silicon nitride. Both hard-mask layers may be formed on the semiconductor substrate 100 with various deposition processes include, but are not limited to: physical vapor deposition (PVD), chemical vapor deposition (CVD), atomic layer deposition (ALD), electrochemical deposition, and spin coating. The second hard-mask layer 300 is deposited on top of the first hard-mask layer 200. FIG. 1B is a schematic cross-sectional diagram representing a plurality of trench openings 1000 are formed on the semiconductor substrate 100 extended vertically through the first hard-mask layer 200 and the second hard-mask layer 300. The plurality of trench openings 1000 created on the fin-patterning substrate is obtained through a regular photolithographic process and an etch process. A typical photolithographic process includes the following steps: preparing substrate, coating photoresist, baking, exposing and developing. In the process of forming a plurality of trench openings 1000 on the fin-patterning substrate, first a patterned resist is formed on the second hard-mask layer, within which the patterned resist contains a trench pattern defined therein, and then the trench pattern from the patterned resist is transferred to the semiconductor substrate 100 by etching through the first hard-mask layer 200 and second hard-mask layer 300 to the semiconductor substrate 100 to form the plurality of trench openings 1000. The trench width of the trench opening 1000 may be in a range from about 4 nm to about 30 nm, the pitch (distance between the centers of two adjacent trench openings) of the trench openings 1000 is ranging from about 10 nm to about 80 nm, and depth of the trench opening 1000 may be in a range from about 10 nm to about 200 nm. The pattern of the trench openings may be obtained with a conventional lithography such as, an ArF (193 nm) deep UV (DUV) immersion lithography. The patterning process may use negative tone development (NTD) process with solvent-based developer. In NTD process, trenches are printed in positive resist using bright-field masks, and consequently with better image contrast. The etch process used for creating the trench openings 1000 may be any conventional reactive ion etching (RIE) processes using different etchants to etch the second hard-mask layer 300, the first hard-mask layer 200, and the semiconductor substrate 100. The etchant or etchants may contain fluorine. In a preferred embodiment the semiconductor substrate is a silicon wafer. A break through etch is first used to remove material on the surface of the hard-mask followed by a conventional etch to remove the hard-mask material. Next an HBr dry etch is used to remove silicon selective to the hard-mask materials.

FIG. 2A is a schematic top-view diagram representing the plurality of trench openings 1000 of FIG. 1B are filled with a shallow trench isolation (STI) process on the fin-patterning substrate to form a plurality of hard-mask mandrels 201, and FIG. 2B is a corresponding schematic cross-sectional diagram of FIG. 2A. The trench openings 1000 as shown in FIG. 1B, may be filled in with a third hard-mask material which may be the same material as the first hard-mask material, such as silicon oxide, to form a plurality of hard-mask mandrels 201. Many different silicon oxides may be used to fill the trench openings 1000 with different deposition processes. The filling process is a typical STI process. STI is an integrated circuit feature which prevents electrical current leakage between adjacent device components. The key steps of the STI process involve etching a pattern of trenches in the silicon, depositing dielectric material(s) to fill the trenches, and then removing the excess dielectric using chemical mechanical polishing (CMP). The STI process in the present invention can be achieved by: performing high-density plasma chemical vapor deposition (HDPCVD) or atmospheric pressure chemical vapor deposition (APCVD) to fill the plurality of trench openings 1000 with HDPCVD oxide or APCVD oxide; and performing a planarization process with CMP to remove the HDPCVD oxide or the APCVD oxide atop of the second hard-mask layer 300.

After filling the trench openings, the second hard-mask layer is then removed to reveal the plurality of hard-mask mandrels 201. FIG. 3A is a schematic top-view diagram representing the second hard-mask layer 300 of FIGS. 2A and 2B is removed from the fin-patterning substrate, and FIG. 3B is a corresponding schematic cross-sectional diagram of FIG. 3A. FIG. 3B reveals the hard-mask mandrels 201 protruding above the first hard-mask layer 200 over the semiconductor substrate 100, and the figure also reveals openings 2000. When the material of the second hard-mask layer 300 is silicon nitride, the removal process may be a wet etch process, such as: exposing the fin-patterning substrate to a chemical solution which contains a sulfuric acid component and a hydrogen peroxide component. The removal process may also be a dry etch process, such as: RIE with etchants include one or both of $NH_3$ and $SF_6$, in combination with HBr and $N_2$.

Figure 4:
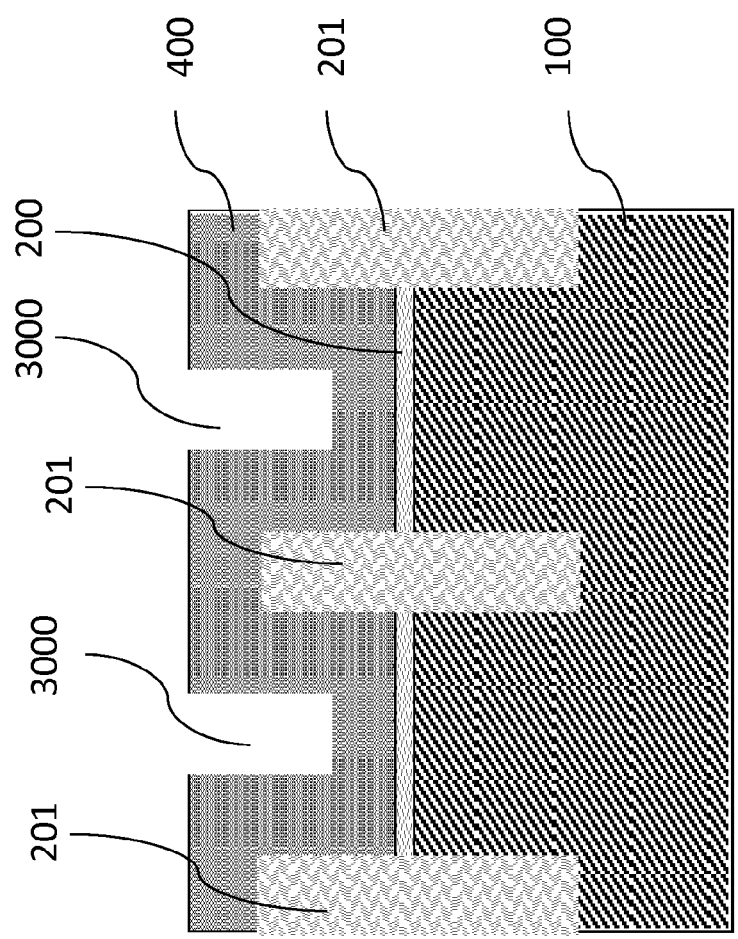
FIG. 4 is a schematic cross-sectional diagram representing a first spacer material is conformally deposited on the fin-patterning substrate of FIGS. 3A and 3B according to one embodiment of the present invention.

FIG. 4 is a schematic cross-sectional diagram representing a layer of first spacer material 400 is conformally deposited on the fin-patterning substrate of FIGS. 3A and 3B, the figure reveals new openings 3000 with a narrower space width. After removing the second hard-mask layer 300, a layer of first spacer material 400 is formed to cover the top of the first hard-mask layer 200 under openings 2000, and to cover top and sides of the plurality of hard-mask mandrels 201, by conformally depositing the first spacer material onto the fin-patterning substrate using ALD process. The layer of first spacer material 400 covers the surface of the entire top area of the fin-patterning substrate including any sidewalls of the features on top of the fin-patterning substrate. The new layer of the first spacer material 400 may include silicon oxide, silicon nitride, titanium nitride, boron nitride, amorphous carbon, metal, and/or metal oxide, and may have a thickness ranging from about 4 nm to about 20 nm and should be proportional to the size of the feature intended to be patterned. The material for the first spacer is chosen so that the material of the first hard-mask layer 200 has etch selectivity over the material of the first spacer, for example the etch rate for the material of the first hard-mask layer 200 is substantially faster than that of the material of the first spacer material under one etch condition. Preferably, the material for the first spacer is silicon nitride. ALD method is suitable for making smooth, conformal layers. The ALD process deposits thin film on a substrate by using two or more different gases species (vapor phase precursors). The surface of the substrate onto which the thin film is to be deposited is exposed to vapors from two or more precursors in a series of sequential, non-overlapping pulses. In each of these pulses, the ALD reaction is self-limiting, thus only a certain maximum thickness can form in a cycle (exposed to all precursors). Because of this self-limiting character, by varying the number of cycles the ALD is possible to grow materials uniformly and conformally over flat surfaces, small holes and narrow trenches with high precision.

FIG. 5A is a schematic top-view diagram representing the first spacer material is removed from the top of the entire fin-patterning substrate and from the line ends of the hard-mask mandrels 201 on the fin-patterning substrate of FIG. 4. FIG. 5B is a corresponding schematic cross-sectional diagram of FIG. 5A. The material of the first spacer on the tops of the first hard-mask layer 200 and the hard-mask mandrels 201, the horizontal top surfaces, is removed with anisotropic reactive ion etching (RIE). Since the deposition of the layer of the first spacer material 400 is conformal, it forms loops surrounding the first hard-mask mandrels 201. The loops need to be trimmed, i.e., the first spacer material at the line ends of the first hard-mask mandrels 201 needs to be removed. The material of the first spacer on the two sides of the two ends, vertical surfaces on the sidewalls of line ends 21, of each hard-mask mandrel 201 is removed by tilt angle ion beam by orienting each side of the two ends to have a non orthogonal tilt angle between a path of the ion beam and the surface of the side being etched. After etching, the material of the first spacer on the two sidewalls of the hard-mask mandrels 201 is left to form a plurality of first sidewall spacers 400a. For example, the spacer removal may be accomplished using a tilted angle ion implant of Xe, Si or Ge followed by a wet etch of hydrofluoric acid. As shown in FIG. 5A, the sidewalls of line ends 21 of the hard-mask mandrels 201 are clean without the first spacer material. The tilt angle beam may also trim the line end of the first sidewall spacers 400a to have the same line length as that of the hard-mask mandrels 201. To trim the loops, instead of etching with tilt angle beam, it can also be achieved by introducing a trim mask and applying conventional lithographic and etching processes. The cross-sectional side-view diagram as shown in FIG. 5B illustrates well defined first sidewall spacers 400a on opposite sides of the hard-mask mandrels 201 and new openings 3001 on the surface of the first had-mask layer 200. When the first spacer material is silicon nitride, it can be removed from horizontal surfaces and one set of vertical surfaces by RIE with etchants including one or both of $NH_3$ and $SF_6$, in combination with HBr and $N_2$.

Figure 5:
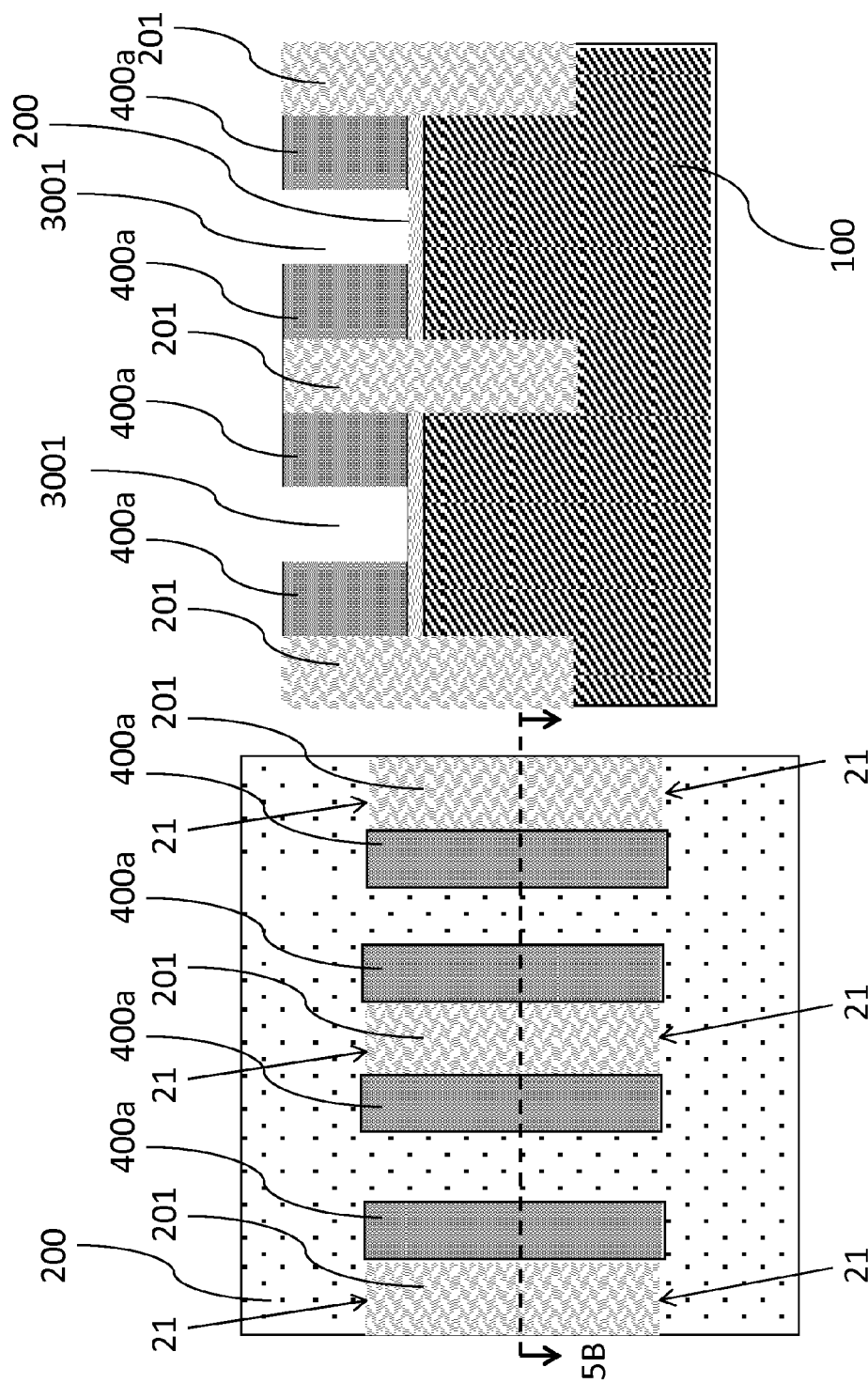
FIG. 5A is a schematic top-view diagram representing the first spacer material is removed from the top of the entire fin-patterning substrate and from the line ends of the hard-mask mandrels on the fin-patterning substrate of FIG. 4.
FIG. 5B is a schematic cross-sectional diagram representing the first spacer material is removed from the top of the entire fin-patterning substrate and from the line ends of the hard-mask mandrels on the fin-patterning substrate of FIG. 4 according to one embodiment of the present invention.
Figure 6:
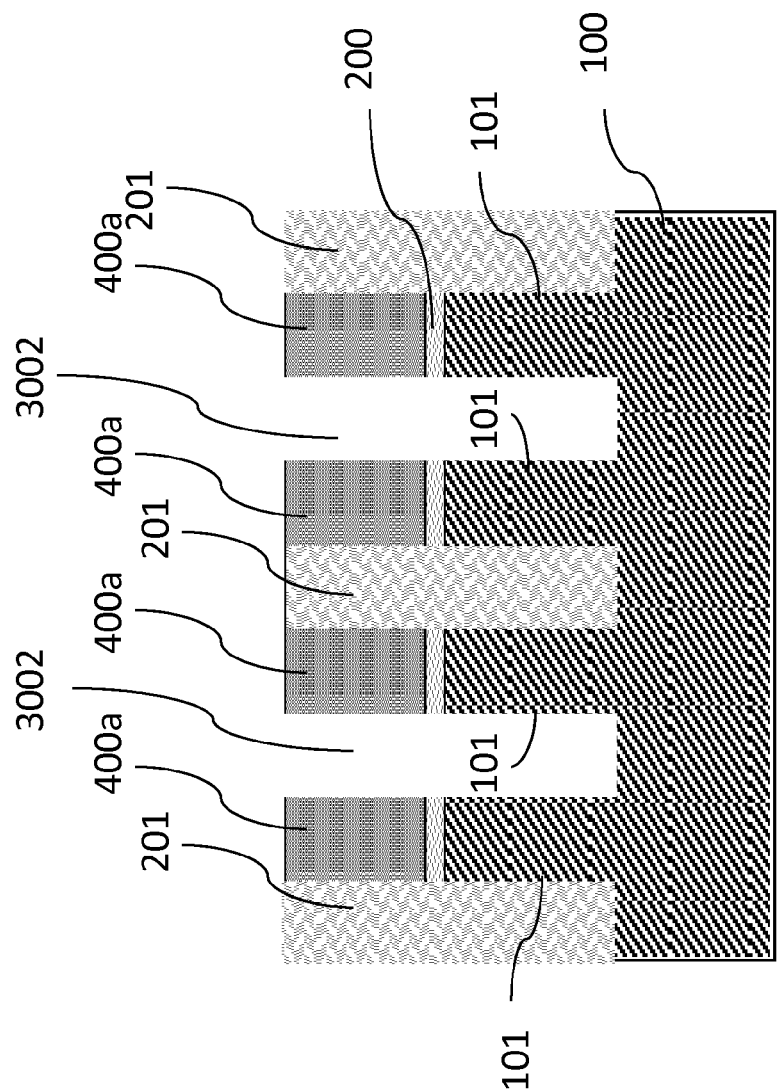
FIG. 6 is a schematic cross-sectional diagram representing the first hard-mask layer and the semiconductor substrate on the fin-patterning substrate of FIG. 5 are etched through the openings to form deep trench openings and fin structures according to one embodiment of the present invention.

Following the step illustrated in FIGS. 5A and 5B, the plurality of hard-mask mandrels 201 and the plurality of first sidewall spacers 400a are used as mask, and a breakthrough etch step is used to remove the first hard-mask layer 200 under the openings 3001 or open areas which are not covered by the hard-mask mandrels 201 and the first sidewall spacers 400a. After the breakthrough etch step, a new etchant may be used to etch the semiconductor substrate 100 to form fin structures. The new etchant may contain HBr. FIG. 6 is a schematic cross-sectional diagram representing the first hard-mask layer 200 and the semiconductor substrate 100 on the fin-patterning substrate of FIG. 5 are etched through the openings 3001 to form deep trench openings 3002 and fin structures 101. The depth of the deep trench openings 3002 is about the same as the height of the hard-mask mandrels 201. The breakthrough etch may use etchants containing fluorine, such as: $CF_4$, and/or $CF_2/CH_2F_2$. The silicon etch process for the semiconductor substrate 100 may use etchants such as: $Cl_2$/$HBr/CF_4/O_2$, and/or $HBr/O_2$.

Figure 7:
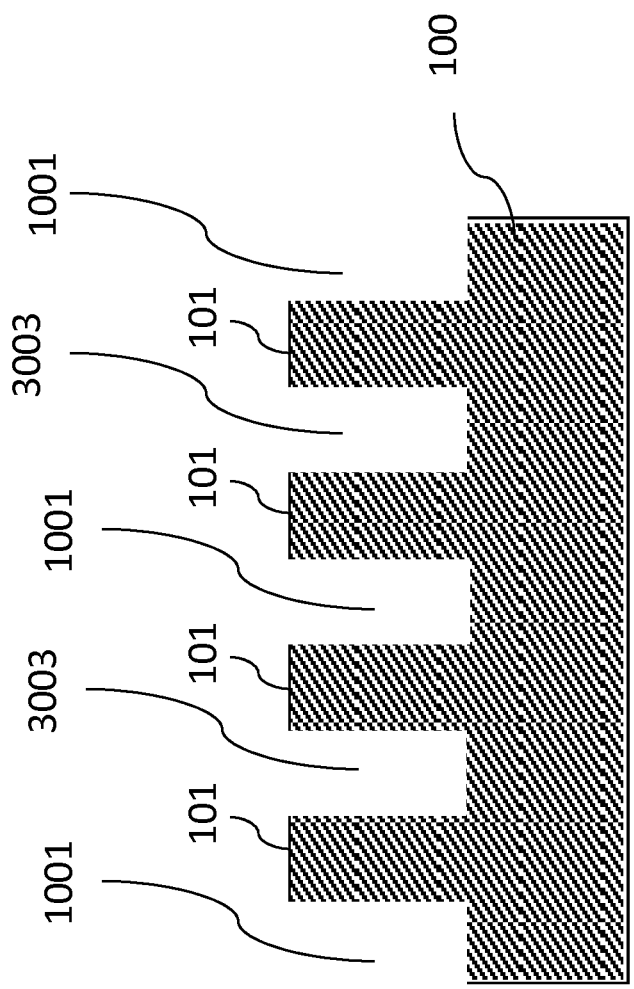
FIG. 7 is a schematic cross-sectional diagram representing the revealing of the fin structures on semiconductor substrate after the first hard-mask layer, the first sidewall spacers and the hard-mask mandrels are removed from the fin-patterning substrate of FIG. 6 according to one embodiment of the present invention.

FIG. 7 is a schematic cross-sectional diagram representing the revealing of the fin structures 101 on the semiconductor substrate 100 after the first hard-mask layer 200, the first sidewall spacers 400a and the hard-mask mandrels 201 are removed from the fin-patterning substrate of FIG. 6. FIG. 7 also reveals new openings 1001 and 3003. The removal process may be a wet etch process. The hard-mask mandrels 201, the first sidewall spacers 400a and the remaining first hard-mask layer 200 are removed to reveal fin structures 101 by exposing the fin-patterning substrate to an oxide removal agent which includes hydrogen fluoride in an aqueous solution in a range of approximately 5:1 to 20,000:1 (water: hydrogen fluoride). The wet process may further contain exposing the fin-patterning substrate to a nitride removal agent which contains a sulfuric acid component and a hydrogen peroxide component. The removal process may be a dry etch RIE process with etchants containing fluorine, such as: $CF_4$, and/or $CF_2/CH_2F_2$. The dry etch RIE process may further contain an additional etch step with etchants include one or both of $NH_3$ and $SF_6$, in combination with HBr and $N_2$. The revealed fin structures 101 may have a fin pitch less than about 20 nm.

Another embodiment of the present invention includes a method of using sidewall image transfer process to pattern fin structures. The method contains the following steps: providing a fin-patterning substrate containing a first hard-mask layer and a second hard-mask layer over a semiconductor substrate, wherein the second hard-mask layer is on top of the first hard-mask layer; forming a plurality of trench openings on the semiconductor substrate extending vertically through the first hard-mask layer and the second hard-mask layer; filling the plurality of trench openings with a third hard-mask material to form a plurality of hard-mask mandrels; removing the second hard-mask layer to reveal the plurality of hard-mask mandrels; forming a layer of first spacer material covering top of the first hard-mask layer under openings, and top and sides of the plurality of hard-mask mandrels; removing first spacer material from the top of the first hard-mask layer and the top of the hard-mask mandrels, and from sides on two line ends of each hard-mask mandrel to form a plurality of first sidewall spacers; forming a layer of second spacer material covering all tops and sides adjacent to air of the first hard-mask layer, the plurality of hard-mask mandrels, and the plurality of first sidewall spacers; removing second spacer material from the tops and sides of the first hard-mask layer, the plurality of hard-mask mandrels, and the plurality of first sidewall spacers, except two opposite sidewalls of each of the first sidewall spacers to form a plurality of second sidewall spacers; forming third spacers with a third spacer material directly on top of the first hard-mask layer under openings; removing the plurality of second sidewall spacers; etching through the first hard-mask layer under openings into the semiconductor substrate to form fin structures under the first sidewall spacers and the third spacers; and removing the plurality of hard-mask mandrels, the plurality of first sidewall spacers, the third spacers and the first hard-mask layer to reveal the fin structures. The sequence of the steps as described above is preferred. However, the invention is not limited to the performance of these steps with the sequence or order presented above. Many steps may also be applied to the fin-patterning substrate before, between or after the steps shown above. FIGS. 1-3 and FIGS. 8-15 are demonstrative illustrations of cross-sectional views or top views of structures in the method of fin patterning of the embodiment of the present invention.

Figure 8:
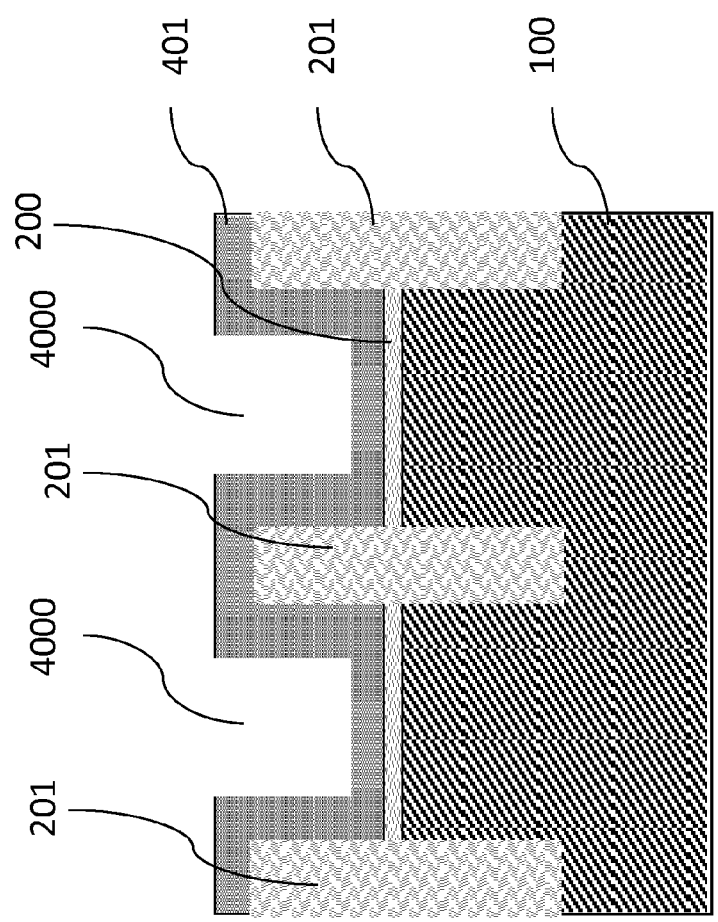
FIG. 8 is a schematic cross-sectional diagram representing a thin film of the first spacer material is conformally deposited on the fin-patterning substrate of FIGS. 3A and 3B according to one embodiment of the present invention.

The following steps are described in the previous paragraphs and demonstratively illustrated in the drawings of FIGS. 1A, 1B, 2A, 2B, 3A, and 3B, which are: providing a fin-patterning substrate containing a first hard-mask layer and a second hard-mask layer over a semiconductor substrate, wherein the second hard-mask layer is on top of the first hard-mask layer; forming a plurality of trench openings on the semiconductor substrate extending vertically through the first hard-mask layer and the second hard-mask layer; filling the plurality of trench openings with a third hard-mask material to form a plurality of hard-mask mandrels; removing the second hard-mask layer to reveal the plurality of hard-mask mandrels. Following the step illustrated in FIGS. 3A and 3B, FIG. 8 is a schematic cross-sectional diagram representing a layer of first spacer material 401 is conformally deposited on the fin-patterning substrate of FIGS. 3A and 3B, and the figure reveals new openings 4000 with a narrower space width. The thickness of the layer of first spacer material 401 shown in FIG. 8 is smaller than that of the layer of first spacer material 400 shown in FIG. 4. Thinner spacer layer allows more density multiplication. For example, a double or triple multiplication process can be converted to quadruple, quintuple, sextuple, or octuple multiplication process by using two or more spacers. After removing the second hard-mask layer 300, a layer of first spacer material 401 is formed to cover the top of the first hard-mask layer 200 under openings 2000, and to cover top and sides of the plurality of hard-mask mandrels 201, by conformally depositing the first spacer material onto the fin-patterning substrate using ALD process. The layer of first spacer material 401 covers the surface of the entire top area of the fin-patterning substrate including any sidewalls of the features on top of the fin-patterning substrate. After deposition, new openings 4000 exhibits smaller space width. The new layer of first spacer material 401 may include silicon oxide, silicon nitride, titanium nitride, boron nitride, amorphous carbon, metal, and/or metal oxide, and may have a thickness ranging from about 4 nm to about 20 nm. The material for the first spacer is chosen so that the material of the first hard-mask layer 200 has etch selectivity over the material of the first spacer. Preferably, the material for the first spacer is silicon nitride. ALD method is suitable for making smooth, conformal layers, and is a preferable deposition method for depositing the layer of first spacer material 401 in the present invention.

Figure 9:
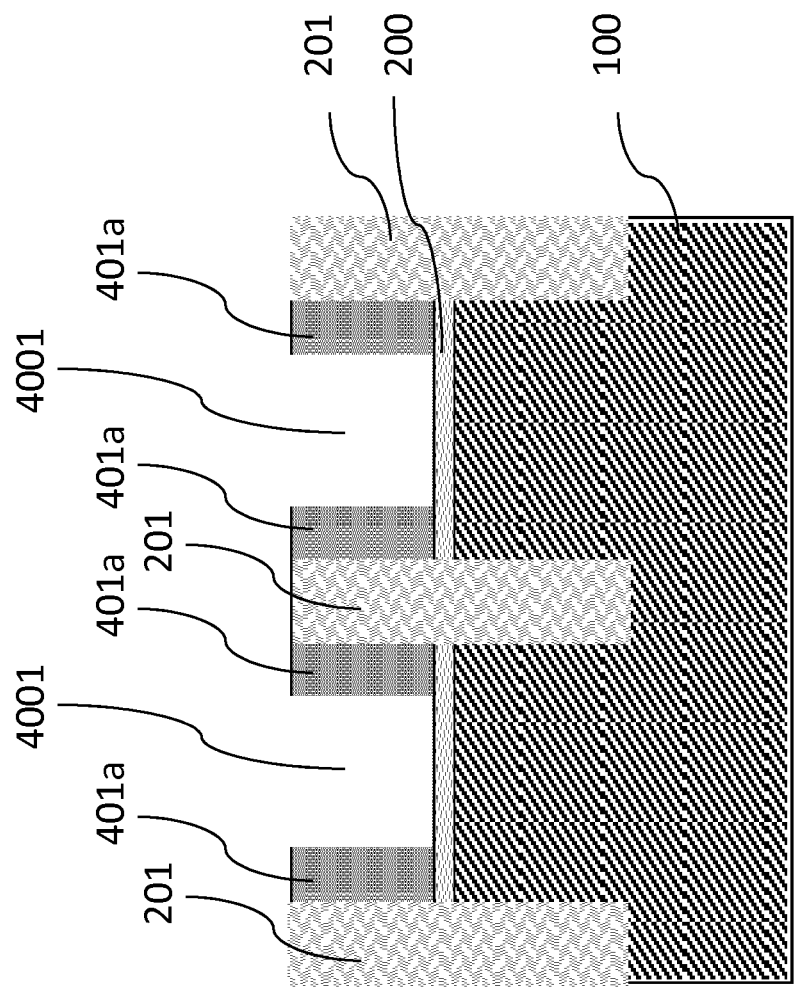
FIG. 9 is a schematic cross-sectional diagram representing the first spacer material is removed from the top of the entire fin-patterning substrate and from the line ends of the hard-mask mandrels on the fin-patterning substrate of FIG. 8 according to one embodiment of the present invention.

FIG. 9 is a schematic cross-sectional diagram representing the first spacer material is removed from the top of the entire fin-patterning substrate and from the line ends of the hard-mask mandrels on the fin-patterning substrate of FIG. 8. The material of the first spacer on the tops of the first hard-mask layer 200 and the hard-mask mandrels 201, the horizontal top surfaces, is removed with anisotropic reactive ion etching (RIE). Since the deposition of the layer of first spacer material 401 is conformal, it forms loops surrounding the first hard-mask mandrels 201. The loops need to be trimmed, i.e., the first spacer material at the line ends of the first hard-mask mandrels 201 needs to be removed. The material of the first spacer on the two sides of the two ends, vertical surfaces on the sidewalls of line ends, of each hard-mask mandrel 201 is removed by tilt angle ion beam by orienting each side of the two ends to have a non orthogonal tilt angle between a path of the ion beam and the surface of the side being etched. After etching, the material of the first spacer on the two sidewalls of the hard-mask mandrels 201 is left to form a plurality of first sidewall spacers 401a. The tilt angle beam may also trim the line end of the first sidewall spacers 401a to have the same line length as that of the hard-mask mandrels 201. To trim the loops, instead of etching with tilt angle beam, it can also be achieved by introducing a trim mask and applying conventional lithographic and etching processes. The cross-sectional side-view diagram as shown in FIG. 8 illustrates well defined first sidewall spacers 401a on opposite sides of the hard-mask mandrels 201 and new openings 4001 on the surface of the first had-mask layer 200. When the first spacer material is silicon nitride, it can be removed from horizontal surfaces and one set of vertical surfaces by RIE with etchants including one or both of $NH_3$ and $SF_6$, in combination with HBr and $N_2$.

Figure 10:
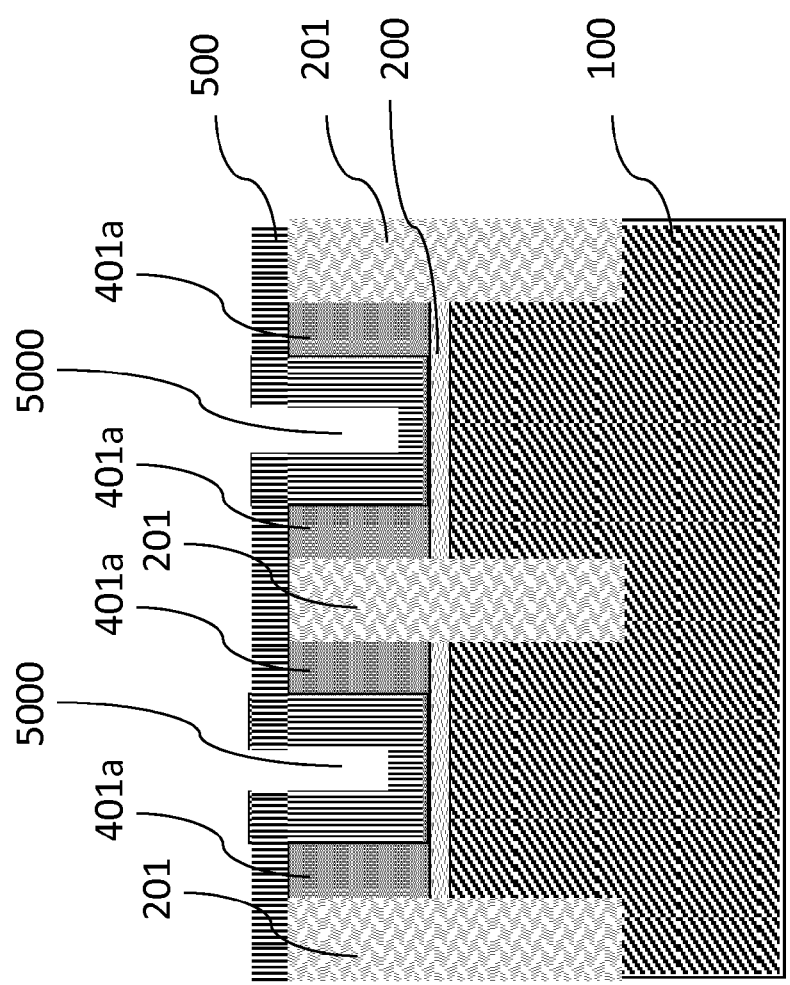
FIG. 10 is a schematic cross-sectional diagram representing a second spacer material is conformally deposited on the fin-patterning substrate of FIG. 9 according to one embodiment of the present invention.

FIG. 10 is a schematic cross-sectional diagram representing a second spacer material is conformally deposited on the fin-patterning substrate of FIG. 9, and the figure reveals new openings 5000 with a narrower space width. After forming the first sidewall spacers 401a, a layer of second spacer material 500 is formed to cover the top of the first hard-mask layer 200 under openings 4001, and to cover top and revealed sides of both the plurality of hard-mask mandrels 201 and the first sidewall spacers 401a, by conformally depositing the second spacer material onto the fin-patterning substrate using ALD process. The layer of second spacer material 500 covers the surface of the entire top area of the fin-patterning substrate including any sidewalls of the features on top of the fin-patterning substrate. The layer of second spacer material 500 may include silicon oxide, silicon nitride, titanium nitride, boron nitride, amorphous carbon, amorphous silicon, amorphous silicon germanium, metal, and/or metal oxide, and may have a thickness ranging from about 4 nm to about 20 nm. The material for the layer of second spacer material 500 is chosen so that the material of the second spacer has etch selectivity over the material of the first sidewall spacers 401a and the material of the hard-mask mandrels 201 under one etch condition. Preferably the material for the second spacer is amorphous silicon, amorphous carbon or amorphous silicon germanium. ALD method is suitable for making smooth, conformal layers.

Figure 11:
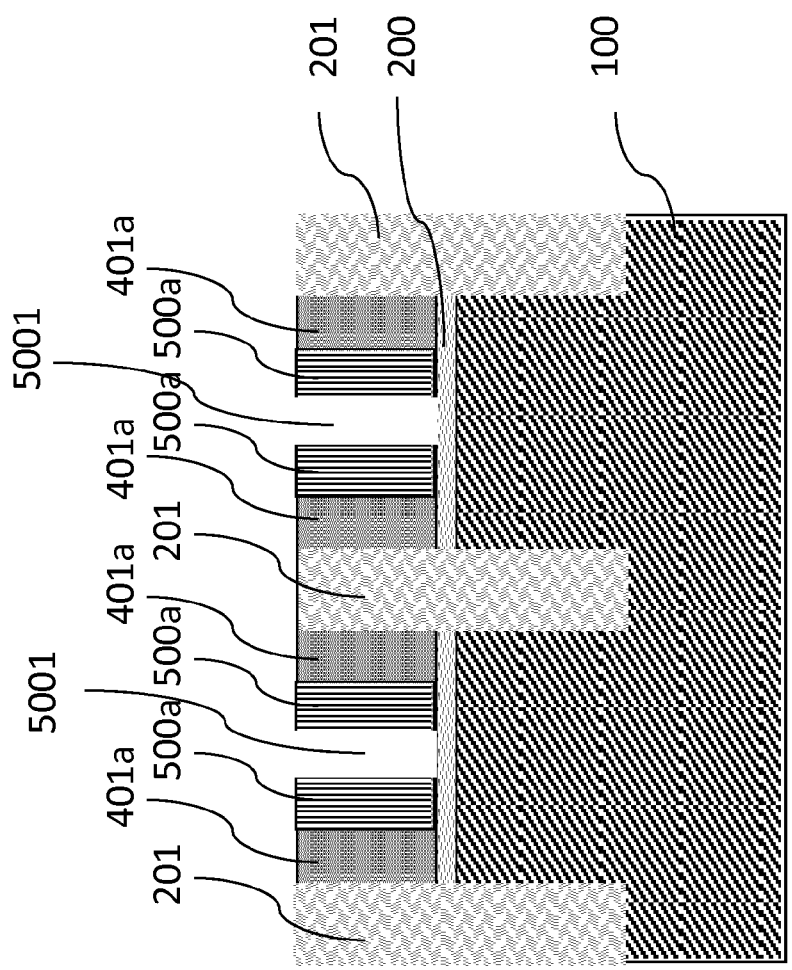
FIG. 11 is a schematic cross-sectional diagram representing the second spacer material is removed from the top of the entire fin-patterning substrate, and from the line ends of both the hard-mask mandrels and the first sidewall spacers on the fin-patterning substrate of FIG. 10 according to one embodiment of the present invention.

FIG. 11 is a schematic cross-sectional diagram representing the second spacer material is removed from the tops of the entire fin-patterning substrate, and from the line ends of both the hard-mask mandrels 201 and the first sidewall spacers 401a on the fin-patterning substrate of FIG. 10. The material of the second spacer on the tops of the first hard-mask layer 200, the first sidewall spacers 401a, and the hard-mask mandrels 201, the horizontal top surfaces, is removed with anisotropic reactive ion etching (RIE). Since the deposition of the layer of second spacer material 500 is conformal, it forms loops surrounding the first hard-mask mandrels 201 and the first sidewall spacers 401a. The loops need to be trimmed, i.e., the second spacer material at the line ends of the first hard-mask mandrels 201 and the first sidewall spacers 401a needs to be removed. The material of the second spacer on the two sides of the two ends, vertical surfaces on the sidewalls of line ends, of each hard-mask mandrel 201 and the first sidewall spacers 401a is removed by tilt angle ion beam by orienting each side of the two ends to have a non orthogonal tilt angle between a path of the ion beam and the surface of the side being etched. After etching, the material of the second spacer on the two opposite sidewalls of the first sidewall spacers 401a is left to form a plurality of second sidewall spacers 500a. The tilt angle beam may also trim the line end of the second sidewall spacers 500a to have the same line length as that of the hard-mask mandrels 201 and the first sidewall spacers 401a. To trim the loops, instead of etching with tilt angle beam, it can also be achieved by introducing a trim mask and applying conventional lithographic and etching processes. The cross-sectional side-view diagram as shown in FIG. 11 illustrates well defined second sidewall spacers 500a on opposite sides of the first sidewall spacers 401a, and new openings 5001 created between the second sidewall spacers 500a on the surface of the first had-mask layer 200. The openings 5001 also include any other areas not covered by the second sidewall spacers 500a, the hard-mask mandrels 201 and the first sidewall spacers 401a. When the second spacer material is amorphous carbon, it may be removed from horizontal surfaces and one set of vertical surfaces by RIE with etchants including $O_2$, and/or $N_2/H_2$. When the second material is amorphous silicon, it may be removed bt RIE with etchants such as: $Cl_2/HBr/CF_4/O_2$, and/or $HBr/O_2$.

Figure 12:
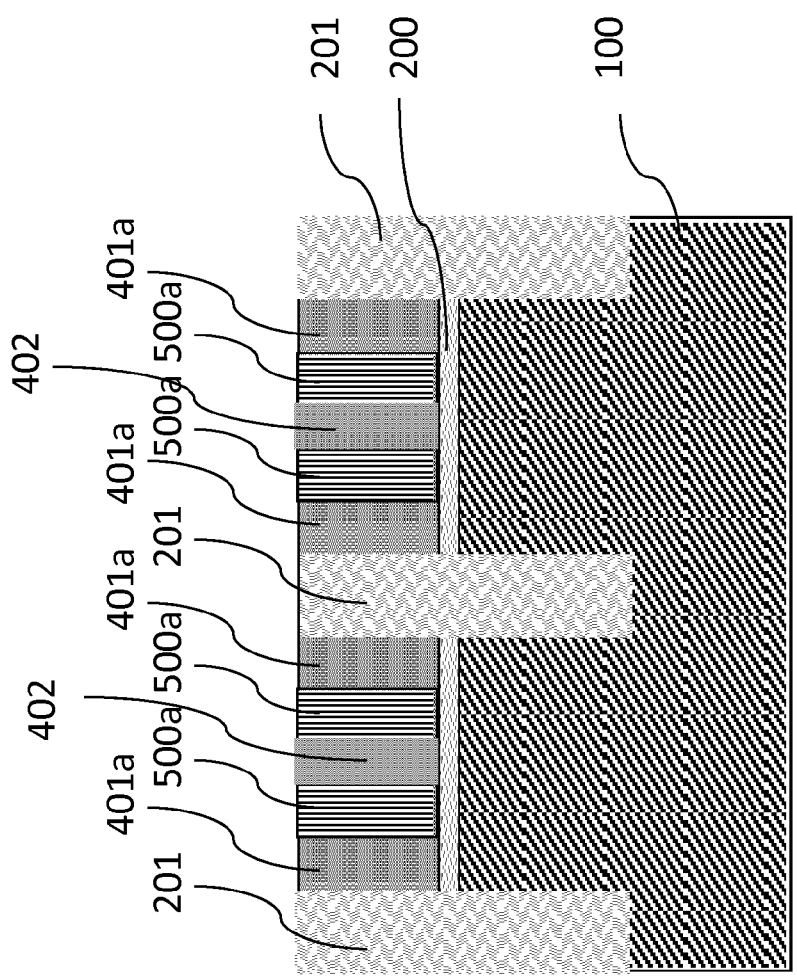
FIG. 12 is a schematic cross-sectional diagram representing a third spacer material is formed in the openings on the fin-patterning substrate of FIG. 11 according to one embodiment of the present invention.

FIG. 12 is a schematic cross-sectional diagram representing a third spacer material is formed in the openings 5001 on the fin-patterning substrate of FIG. 11. After forming the second sidewall spacers 500a, a third spacer material is chosen to fill the openings 5001 to form a plurality of third spacers 402. The forming of the plurality of third spacers 402 may include ALD followed with back etch process or CMP process. It may also use any deposition process similar to a typical STI process. The material of the third spacers 402 may include silicon oxide, silicon nitride, titanium nitride, boron nitride, amorphous carbon, amorphous silicon, amorphous silicon germanium, metal, and/or metal oxide. The material for the third spacers 402 is chosen so that the material of the first hard-mask layer 200 and the material of the second sidewall spacers 500a have etch selectivity over the material of the third spacers 402 under one etch condition. Preferably the material of the third spacers 402 is the same material of the first sidewall spacers 401a, and it may be silicon nitride. ALD method is suitable for making smooth, conformal layers and is a preferred deposition process for depositing the third spacer material.

Figure 13:
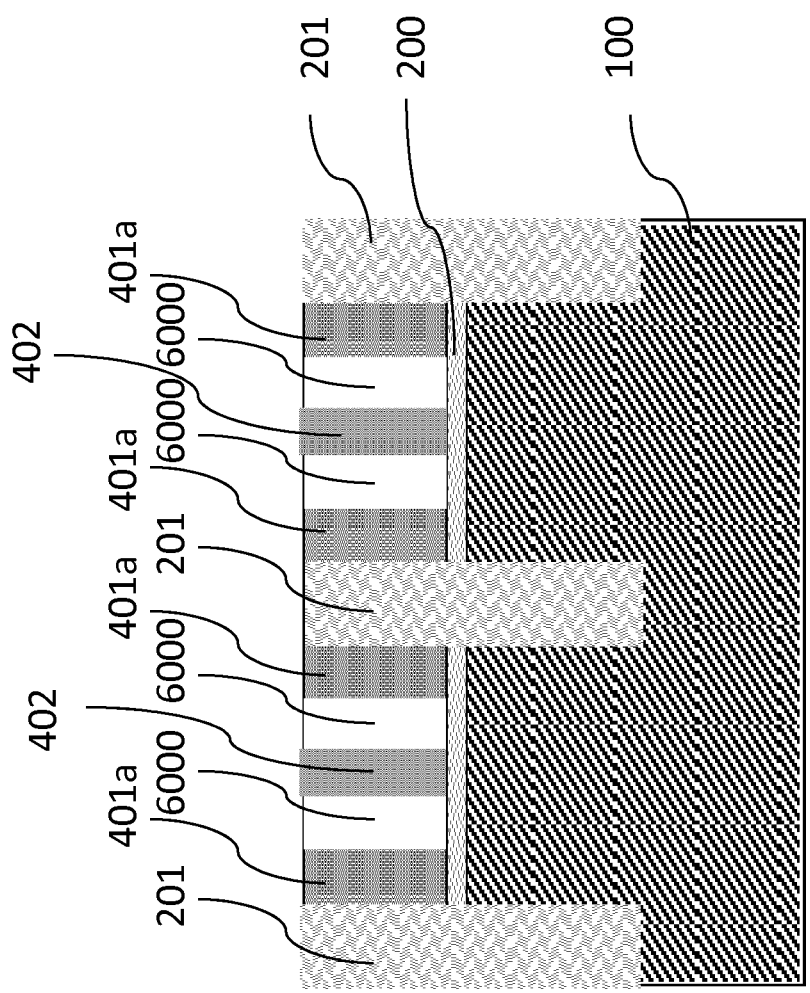
FIG. 13 is a schematic cross-sectional diagram representing the second sidewall spacers are removed from the fin-patterning substrate of FIG. 11 according to one embodiment of the present invention.

After forming the third spacers 402 on top of the first hard-mask layer 200 to fill the openings 5001, the plurality of second sidewall spacers 500a are removed. FIG. 13 is a schematic cross-sectional diagram representing the second sidewall spacers 500a are removed from the fin-patterning substrate of FIG. 12 to reveal new openings 6000. When the second spacer material is amorphous carbon, it may be removed by RIE with etchants including $O_2$, and/or $N_2/H_2$.

When the second spacer material is amorphous silicon, it may be removed by RIE with etchants such as: $Cl_2/HBr/CF_4/O_2$, and/or $HBr/O_2$.

Figure 14:
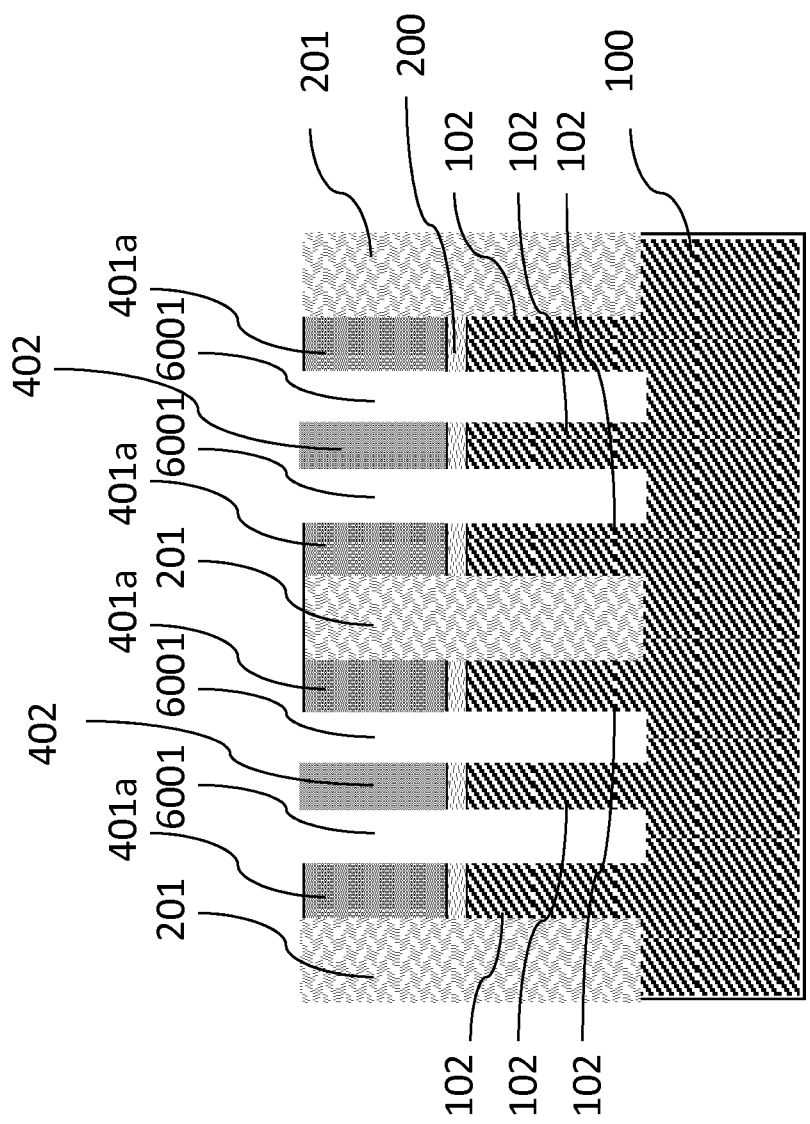
FIG. 14 is a schematic cross-sectional diagram representing the first hard-mask layer and the semiconductor substrate on the fin-patterning substrate of FIG. 13 are etched through the openings to form deep trench openings and fin structures according to one embodiment of the present invention.

Following the step illustrated in FIG. 13, the plurality of hard-mask mandrels 201, the plurality of first sidewall spacers 401a, and the plurality of third spacers 402 are used as mask, and a break through etch step is used to remove the first hard-mask layer 200 under the openings 6000 or open areas which are not covered by the hard-mask mandrels 201, the first sidewall spacers 401a, and the third spacers 402. After the breakthrough etch step, a new etchant may be used to etch the semiconductor substrate 100 to form fin structures. The new etchant may contain HBr. FIG. 14 is a schematic cross-sectional diagram representing the first hard-mask layer 200 and the semiconductor substrate 100 on the fin-patterning substrate of FIG. 13 are etched through the openings 6000 to form deep trench openings 6001 and fin structures 102. The depth of the deep trench openings 6001 is about the same as the height of the hard-mask mandrels 201. The breakthrough etch may use etchants containing fluorine, such as: $CF_4$, and/or $CF_2/CH_2F_2$. The silicon etch process for the semiconductor substrate 100 may use etchants such as: $Cl_2/HBr/CF_4/O_2$, and/or $HBr/O_2$.

Figure 15:
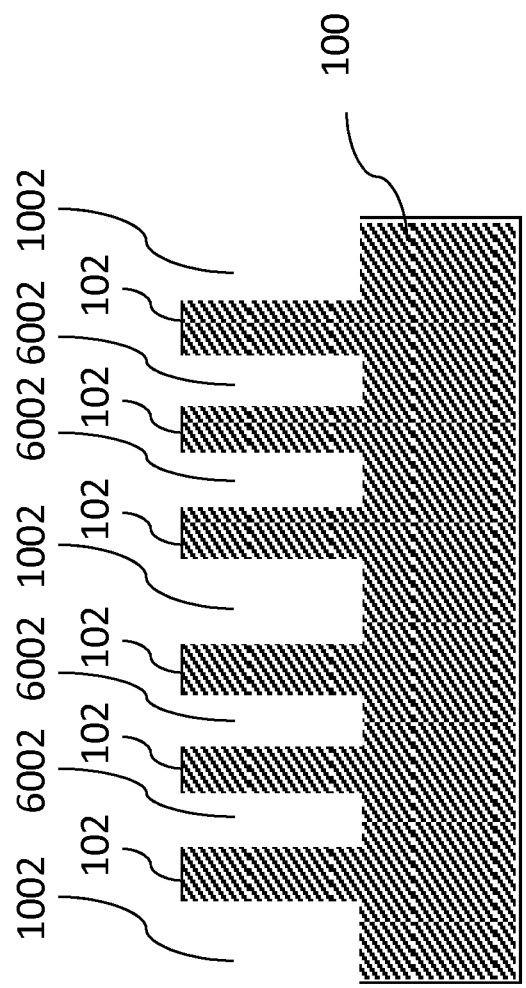
FIG. 15 is a schematic cross-sectional diagram representing the revealing of the fin structures on semiconductor substrate after the first hard-mask layer, the first sidewall spacers, the third spacers and the hard-mask mandrels are removed from the fin-patterning substrate of FIG. 14 according to one embodiment of the present invention.

FIG. 15 is a schematic cross-sectional diagram representing the revealing of the fin structures 102 on the semiconductor substrate 100 after the first hard-mask layer 200, the first sidewall spacers 401a, the third spacers 402 and the hard-mask mandrels 201 are removed from the fin-patterning substrate of FIG. 14. FIG. 15 also reveals new openings 1002 and 6002. The removal process may be a wet etch process. The hard-mask mandrels 201, the first sidewall spacers 401a, the third spacers 402, and the remaining first hard-mask layer 200 are removed to reveal fin structures 102 by exposing the fin-patterning substrate to an oxide removal agent which includes hydrogen fluoride in an aqueous solution in a range of approximately 5:1 to 20,000:1 (water:hydrogen fluoride). The wet process may further contain exposing the fin-patterning substrate to a nitride removal agent which contains a sulfuric acid component and a hydrogen peroxide component. The removal process may be a dry etch RIE process with etchants containing fluorine, such as: $CF_4$, and/or $CF_2/CH_2F_2$. The dry etch RIE process may further contain an additional etch step with etchants include one or both of $NH_3$ and $SF_6$, in combination with HBr and $N_2$. The revealed fin structures 102 may have a fin pitch less than about 20 nm.

What is claimed is:

1. A method for fin patterning comprising:
   providing a fin-patterning substrate comprising a first hard-mask layer and a second hard-mask layer over a semiconductor substrate, wherein the second hard-mask layer is on top of the first hard-mask layer;
   forming a plurality of trench openings on the semiconductor substrate extending vertically through the first hard-mask layer and the second hard-mask layer;
   filling the plurality of trench openings with a third hard-mask material to form a plurality of hard-mask mandrels;
   removing the second hard-mask layer to reveal the plurality of hard-mask mandrels protruding above the first hard-mask layer over the semiconductor substrate;
   forming a layer of first spacer material covering top of the first hard-mask layer under openings which are formed after the removing the second hard-mask layer, and covering top and sides of the plurality of hard-mask mandrels;
   removing first spacer material from the top of the first hard-mask layer and the top of the hard-mask mandrels, and from sides on two line ends of each hard-mask mandrel to form a plurality of first sidewall spacers;
   etching through the first hard-mask layer under openings, which are located directly on top of the first hard-mask layer and are on areas where the first spacer material is removed, into the semiconductor substrate to form fin structures under the first sidewall spacers; and
   removing the plurality of hard-mask mandrels, the plurality of first sidewall spacers and the first hard-mask layer to reveal the fin structures.

2. The method of claim 1, wherein forming a plurality of trench openings on the semiconductor substrate comprises:
   forming a patterned resist on the second hard-mask layer, wherein the patterned resist contains a trench pattern; and
   transferring the trench pattern from the patterned resist to the semiconductor substrate by etching through the first and second hard-mask layer to the semiconductor substrate to form the plurality of trench openings.

3. The method of claim 1, wherein material of the first hard-mask layer is silicon oxide.

4. The method of claim 1, wherein filling the plurality of trench openings with a third hard-mask material to form a plurality of hard-mask mandrels comprises:
   performing high-density plasma chemical vapor deposition (HDPCVD) or atmospheric pressure chemical vapor deposition (APCVD) to fill the plurality of trench openings with HDPCVD oxide or APCVD oxide; and
   performing a planarization process with chemical mechanical polishing (CMP) to remove the HDPCVD oxide or the APCVD oxide atop of the second hard-mask layer.

5. The method of claim 1, wherein material of the second hard-mask layer is silicon nitride.

6. The method of claim 1, wherein removing the second hard-mask layer to reveal the plurality of hard-mask mandrels comprises: exposing the fin-patterning substrate to a chemical solution, wherein the chemical solution comprises a sulfuric acid component and a hydrogen peroxide component.

7. The method of claim 1, wherein forming a layer of first spacer material comprises: conformally depositing the first spacer material onto the fin-patterning substrate using atomic layer deposition (ALD).

8. The method of claim 1, wherein the first spacer material is silicon nitride.

9. The method of claim 1, wherein removing first spacer material from sides on two line ends of each hard-mask mandrel comprises: orienting each side of the two line ends to have a non orthogonal tilt angle between a path of an ion beam and surface of the side during a reactive ion etching process.

10. The method of claim 1, wherein removing the plurality of hard-mask mandrels, the plurality of first sidewall spacers and the first hard-mask layer comprises: exposing the fin-patterning substrate to an oxide removal agent which includes hydrogen fluoride in an aqueous solution in a range of approximately 5:1 to 20,000:1 (water:hydrogen fluoride).

11. A method for fin patterning comprising:
    providing a fin-patterning substrate comprising a first hard-mask layer and a second hard-mask layer over a semiconductor substrate, wherein the second hard-mask layer is on top of the first hard-mask layer;
    forming a plurality of trench openings on the semiconductor substrate extending vertically through the first hard-mask layer and the second hard-mask layer;
    filling the plurality of trench openings with a third hard-mask material to form a plurality of hard-mask mandrels;

removing the second hard-mask layer to reveal the plurality of hard-mask mandrels protruding above the first hard-mask layer over the semiconductor substrate;

forming a layer of first spacer material covering top of the first hard-mask layer under openings which are formed after the removing the second hard-mask layer, and covering top and sides of the plurality of hard-mask mandrels;

removing first spacer material from the top of the first hard-mask layer and the top of the hard-mask mandrels, and from sides on two line ends of each hard-mask mandrel to form a plurality of first sidewall spacers;

forming a layer of second spacer material covering all tops and sides adjacent to air of the first hard-mask layer, the plurality of hard-mask mandrels, and the plurality of first sidewall spacers;

removing second spacer material from the tops and sides of the first hard-mask layer, the plurality of hard-mask mandrels, and the plurality of first sidewall spacers, except two opposite sidewalls of each of the first sidewall spacers to form a plurality of second sidewall spacers;

forming third spacers with a third spacer material directly on top of the first hard-mask layer under openings which are formed after the removing second spacer material;

removing the plurality of second sidewall spacers;

etching through the first hard-mask layer under openings, which are located directly on top of the first hard-mask layer and are on areas where the second sidewall spacers are removed, into the semiconductor substrate to form fin structures under the first sidewall spacers and the third spacers; and removing the plurality of hard-mask mandrels, the plurality of first sidewall spacers, the third spacers and the first hard-mask layer to reveal the fin structures.

12. The method of claim 11, wherein the third spacer material is same as the first spacer material.

13. The method of claim 11, wherein forming a plurality of trench openings on the semiconductor substrate comprises:
    forming a patterned resist on the second hard-mask layer, wherein the patterned resist contains a trench pattern; and
    transferring the trench pattern from the patterned resist to the semiconductor substrate by etching through the first and second hard-mask layer to the semiconductor substrate to form the plurality of trench openings.

14. The method of claim 11, wherein material of the first hard-mask layer is silicon oxide.

15. The method of claim 11, wherein filling the plurality of trench openings with a third hard-mask material to form a plurality of hard-mask mandrels comprises:
    performing high-density plasma chemical vapor deposition (HDPCVD) or atmospheric pressure chemical vapor deposition (APCVD) to fill the plurality of trench openings with HDPCVD oxide or APCVD oxide; and
    performing a planarization process with chemical mechanical polishing (CMP) to remove the HDPCVD oxide or the APCVD oxide atop of the second hard-mask layer.

16. The method of claim 11, wherein forming a layer of first spacer material comprises: conformally depositing the first spacer material onto the fin-patterning substrate using atomic layer deposition (ALD).

17. The method of claim 11, wherein the first spacer material is silicon nitride.

18. The method of claim 11, wherein the second spacer material is amorphous silicon, amorphous carbon, or amorphous silicon germanium.

19. The method of claim 11, wherein forming a layer of second spacer material comprises: conformally depositing the second spacer material onto the fin-patterning substrate using atomic layer deposition (ALD).

20. The method of claim 11, wherein the fin structures has a fin pitch less than about 20 nm.

* * * * *